US009330738B2

(12) United States Patent
Taylor, Jr.

(10) Patent No.: US 9,330,738 B2
(45) Date of Patent: May 3, 2016

(54) DATA STORAGE USING ANALOG CODING

(71) Applicant: The MITRE Corporation, McLean, VA (US)

(72) Inventor: Robert McCormick Taylor, Jr., New Market, MD (US)

(73) Assignee: The MITRE Corporation, McLean, VA (US)

( * ) Notice: Subject to any disclaimer, the term of this patent is extended or adjusted under 35 U.S.C. 154(b) by 0 days.

(21) Appl. No.: 14/257,492

(22) Filed: Apr. 21, 2014

(65) Prior Publication Data

US 2015/0302906 A1    Oct. 22, 2015

(51) Int. Cl.
| | |
|---|---|
| G11C 27/00 | (2006.01) |
| G11C 7/16 | (2006.01) |
| G11C 13/00 | (2006.01) |
| G11C 7/10 | (2006.01) |
| G11C 8/12 | (2006.01) |

(52) U.S. Cl.
CPC ............... *G11C 7/16* (2013.01); *G11C 7/1006* (2013.01); *G11C 8/12* (2013.01); *G11C 13/0002* (2013.01); *G11C 13/004* (2013.01); *G11C 13/0023* (2013.01); *G11C 13/0069* (2013.01); *G11C 27/005* (2013.01)

(58) Field of Classification Search
CPC ......... G11C 27/005; G11C 27/00; G11C 7/16
USPC ...................................... 365/45, 230.06, 168
See application file for complete search history.

(56) References Cited

U.S. PATENT DOCUMENTS

| | | | | |
|---|---|---|---|---|
| 5,053,744 | A | * | 10/1991 | Tozawa ........................ 340/438 |
| 6,279,133 | B1 | * | 8/2001 | Vafai et al. .................... 714/763 |
| 8,253,443 | B2 | | 8/2012 | Robinett |
| 8,938,575 | B2 | * | 1/2015 | Ordentlich et al. ........... 711/103 |
| 2013/0013977 | A1 | | 1/2013 | Rivers et al. |

OTHER PUBLICATIONS

Berdan, R., et al., "High precision analogue memristor state tuning." *Electronic Letters* 48.18 (2012).
Biolek, D., et al., "Reliable SPICE Simulations of Memristors, Memcapacitors and Meminductors." arXiv:1307.2717v1 [physics.comp-ph] (2013).
Cabe, A. C., et al., "Reducing Stray Currents in Molecular Memory Through Data Encoding." Proceedings of the $7^{th}$ IEEE International Conference on Nanotechnology Hong Kong, pp. 70-75 (2007).
Gao, L., et al., "Analog-Input Analog-Weight Dot-Product Operation with Ag/a-Si/Pt Memristive Devices."
Vontobel, P.O., et al. "Writing to and reading from a nano-scale crossbar memory based on memristors." Nanotechnology 20.42 (2009): 425204.

(Continued)

*Primary Examiner* — Son Dinh
(74) *Attorney, Agent, or Firm* — Sterne, Kessler, Goldstein & Fox P.L.L.C.

(57) ABSTRACT

In an embodiment, a memory system is provided. The memory system can include one or more memory elements, a quantity associated with each of the one or more memory elements can take a value in a continuous range of values; an encoder configured to determine a value for a quantity of a first memory element of the one or more memory elements based on data to be stored; and a memory controller configured to control the first memory element such that the quantity of the first memory element is set to the determined value.

18 Claims, 16 Drawing Sheets

(56) References Cited

OTHER PUBLICATIONS

Yi, W., et al. "Feedback write scheme for memristive switching devices." Applied Physics A 102.4 (2011): 973-982.

Zidan, M.A. et al. "Memristor-based memory: The sneak paths problem and solutions." Preprint submitted to Microelectronics Journal (2012): 1-9.

Niu, D., et al. "Low Power Memristor-Based ReRAM Design with Error Correcting Code." IEEE (2012): 79-84.

Mohammad, B. et al. "Robust Hybrid Memristor-CMOS Memory: Modeling and Design." IEEE (2012): 1-11.

* cited by examiner

DATA STORAGE USING ANALOG CODING

BACKGROUND

1. Field

The present disclosure generally relates to memory systems.

2. Background

Memories can be used in processing systems to allow for temporary or permanent storage of data. For example, a data word resulting from the completion of an instruction or operation can be stored across one or more memory elements for later use. A set of cells can be used to store a complete word, with each cell storing a component of the word (e.g., one bit field).

One implementation of a memory is a device that stores digital values. For example, such a memory can be implemented as a large matrix of digital cells. In digital memories, each cell has an associated quantity that is used to store information. For example, in a dynamic random access memory (DRAM) device, the quantity can be the charge stored in the capacitor of the DRAM cell. When data is written to a digital cell, the quantity is set such that it is below or above a specific threshold (often denoted as a logic '0' or a logic '1,' respectively). Later, when data is to be read from the cell, the value of the quantity is compared to the threshold to determine whether the stored data is a '0' or a '1'.

BRIEF DESCRIPTION OF THE DRAWINGS/FIGURES

The accompanying drawings, which are incorporated herein and form a part of the specification, illustrate the present disclosure and, together with the description, further serve to explain the principles of the disclosure and to enable a person skilled in the pertinent art to make and use the disclosure.

Figure 1:
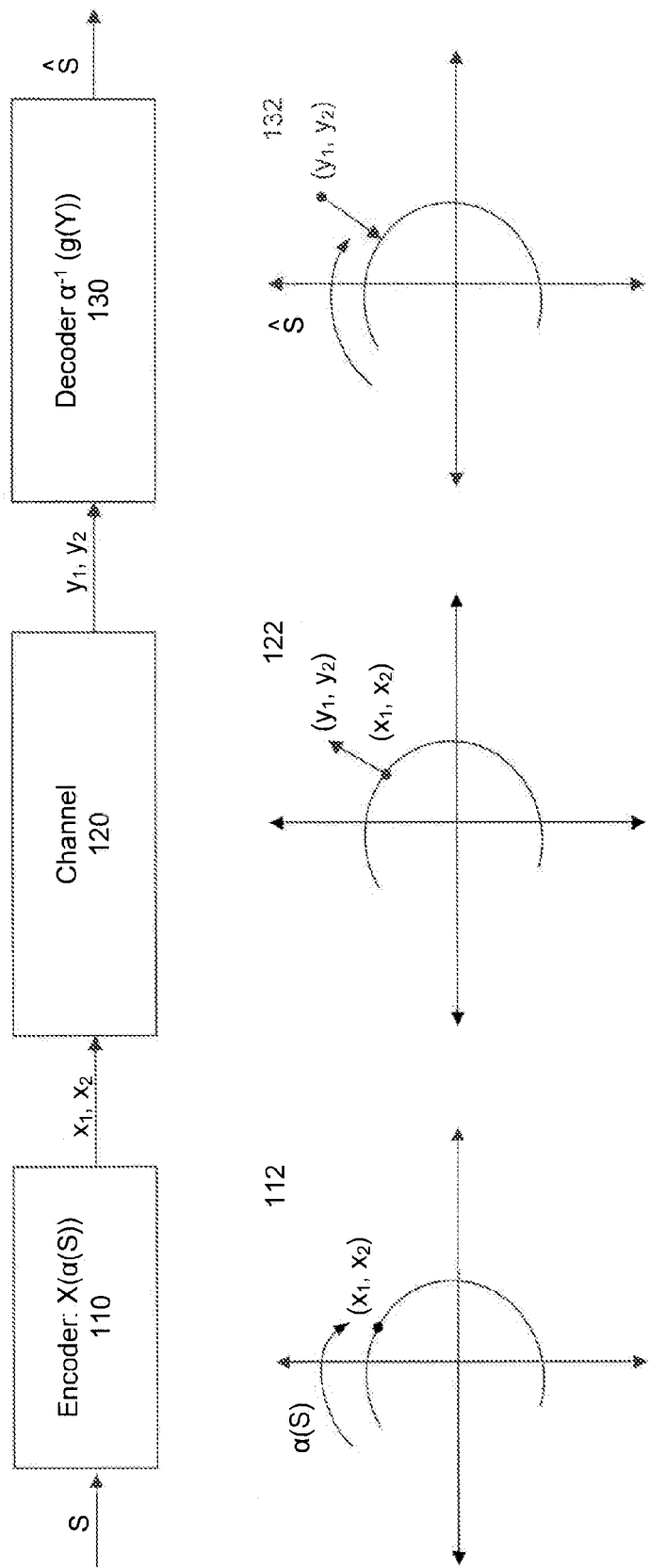
FIG. 1 shows a schematic diagram illustrating analog coding, according to an embodiment.

The present disclosure will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION

I. Introduction

A number of different types of memories exist for storing data. These devices typically store data in digital form. Digital memories can include multiple individual memory elements, each of which has an associated quantity that is used to store data. In the example of a FLASH memory and a dynamic random access memory (DRAM), the quantity associated with each cell is the charge stored in each cell. In the example of memristor-based memories, the quantity is the memductance of each memristor.

In digital memories, the quantity used to store data effectively can only take one of a finite number of discrete values. In particular, the value of the quantity is quantized by comparing it to one or more threshold values. For example, in bi-state memories, the quantity of each cell is compared to one threshold value. As a result, the quantity of the cell can effectively take two values (the value being designated as either below or above the threshold value, often denoted as a '0' or a '1,' respectively).

In embodiments described herein, memory systems and memory encoding methods are provided that allow for data to be stored in analog form. For example, a data to be stored can be mapped to specific value(s) for quantit(ies) in a continuous range of values, e.g., as opposed to digital memories in which the quantity can only be one of a finite number of values. The memory element(s) can be controlled such that their respective quantity is set to the determined value.

Memristors can be used to store analog coded data. Functionally, a memristor can operate as programmable resistor, and can have an associated memductance value that it retains over time (which allows it to function as a memory element). As would be understood by those skilled in the relevant art(s), a memristor can be implemented as a "sandwich" of a metal/insulator/metal (MIM) (e.g., $TiO_2$). For example, an array of memristors can be implemented as a nanoscale crossbar array or matrix in which every crosspoint is a memristor.

In an embodiment, data can be stored use memristors by mapping the data to memductance values of two of memristors of a crossbar array. The stored value can later recovered by measuring the memductance of the two memristors, and estimating the data based on the measured memductances.

Storing information in analog form instead of digital form provides several advantages. For example, analog storage can substantially increase the storage density of a device because fewer memory elements may be needed to store data in analog form as opposed to digital form. In addition, the size of a decoder needed to retrieve analog encoded data can be fabricated smaller than decoders used to retrieve digitally encoded data.

In an embodiment, a memory system can be used to complete at least two types of operations. The first operation can be a reading operation in which the value of a quantity of one or more memory elements is measured and mapped to an estimated value for stored data. For example, a read operation can involve measuring the memductance values of one or more memristors. The second operation can be a writing operation. The writing operation can be completed in two stages. The first stage can be termed a "flush" stage in which the quantity of each memory element is set to a predetermined value. For example, the memductance of one or more memristors can be set to a predetermined value using a "flushing voltage." Next, in the "write stage," the quantity of each memory element is changed to match a determined value. For example, the memductance of each of the one or more memristors can be changed to a determined value. In this way, the quantity of one or more memory elements can be set to a particular value without requiring knowledge of the initial state of the one or more memory elements.

In an alternate embodiment, a writing operation can be implemented using a single stage. In this embodiment, the value of the quantity of the memory elements to which data is to be written is measured and changed using feedback control such that its value matches a predetermined value in a single stage.

FIG. 1 shows a schematic diagram illustrating analog encoding, according to an embodiment. As shown in FIG. 1, encoder 110 receives data to be stored, S. Data S, can be mapped to value(s) for memory element(s). In an embodiment, data S is a sample of a signal or information sequence containing a word of data. In other embodiments, data S can be a different unit of data, e.g., bit(s) or byte(s). In an embodiment, data S can include one number. In alternate embodiments, data S can include sequence of numbers. For example, and as described in greater detail below, data S can be mapped to two values: a value $x_1$ for the quantity of a first memory element and a value $x_2$ for the quantity of a second memory element. As will be appreciated by those skilled in the relevant art(s), FIG. 1 shows the embodiment in which data S stored across two memory elements (e.g., two memristors). In alternate embodiments, data S can be stored across any number of memory elements, N. In such an embodiment, data S is mapped to N different values.

As illustrated in plot 112, encoder 110 performs two functions to map data S to values $(x_1, x_2)$. First, encoder 110 computes $\alpha(S)$. In an embodiment, $\alpha()$ is a scalar-valued stretching function that outputs a distance along a curve that corresponds to data S. Encoder 110 then computes a function, $X()$, which outputs the coordinates for the resulting location on the curve, i.e., coordinates $(x_1, x_2)$. These coordinates can be used as the values for quantities of the first and second memory elements. Encoder 110 outputs values $(x_1, x_2)$ to channel 120.

Channel 120 can approximate the effects of the memory element on the stored values. As will be understood by those of ordinary skill in the relevant art(s), over time, the value(s) of the quantit(ies) of memory elements may change due to a variety of circumstances, e.g., noise and/or accesses to other memory elements in the device. In an embodiment, the effects of these changes can be modeled as Gaussian noise. As shown in plot 122, the values $(x_1, x_2)$ are displaced to coordinates $(y_1, y_2)$.

When the data stored in the memory system is to be accessed, decoder 130 measures the values of the quantities of the first and second memory elements. As shown in plot 132, decoder 130 receives values $(y_1, y_2)$. Decoder 130 first applies a function $g()$ to the measured values. In an embodiment, function $g()$ can be used to project the noisy observation to the closest point on the signal locus. Decoder 130 then applies the inverse stretching function $\alpha^{-1}()$ to calculate an estimate for the originally stored data, S.

II. Exemplary Memory System Overview

Figure 2:
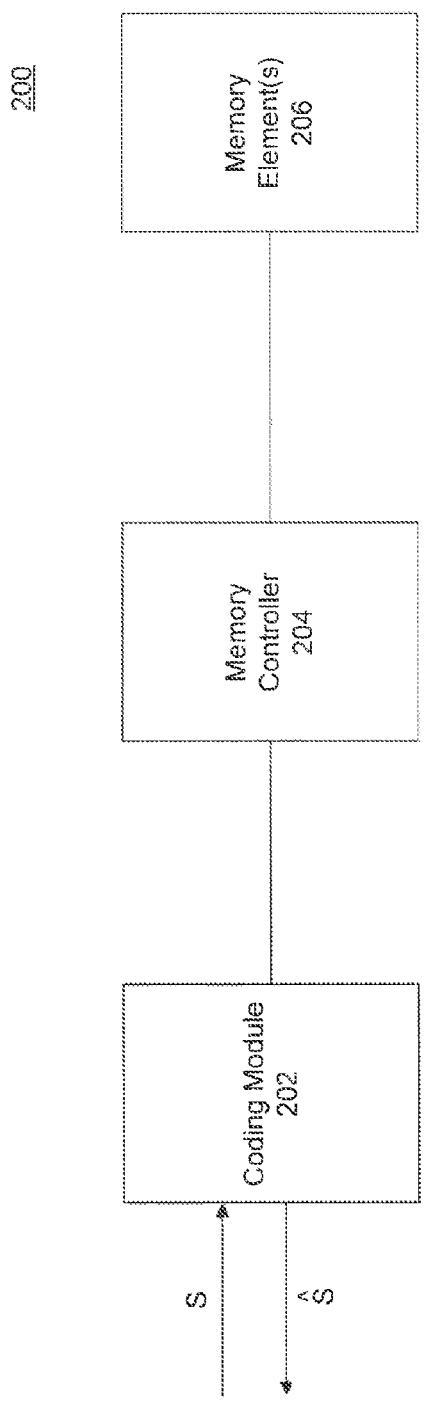
FIG. 2 shows a block diagram of a memory system, according to an embodiment.

FIG. 2 shows a block diagram of a memory system 200, according to an embodiment. Memory system 200 includes a coding module 202, a memory controller 204, and a matrix of memory elements 206. As shown in FIG. 2, coding module 202 receives a data to be stored, S. In an embodiment, coding module 202 implements the functionality of encoder 110 and decoder 130, described above with reference to FIG. 1. For example, coding module 202 receives data S and determines value(s) for quantit(ies) of memory element(s) of matrix 206. For example, in the embodiment in which matrix 206 is implemented as a matrix of memristors, coding module 202 can map the received data S to memductances of one or more memristors. In a further embodiment, coding module 202 can map data S to values $(x_1, x_2)$ for the memductances of two adjacent memristors.

Memory controller 204 controls one or more of memory elements 206 such that the values of their respective quantities are set to the values received from coding module 202. For example, memory controller 204 can receive values $(x_1, x_2)$ from coding module 202 and output voltages that result in the memductances of two of memristors of matrix 206 being changed to values $(x_1, x_2)$. To recover stored data, memory controller 204 can also measure the quantit(ies) associated with memory element(s) of matrix 206. Coding module 202 can map the measured value(s) to an estimate, A.

Figure 3:
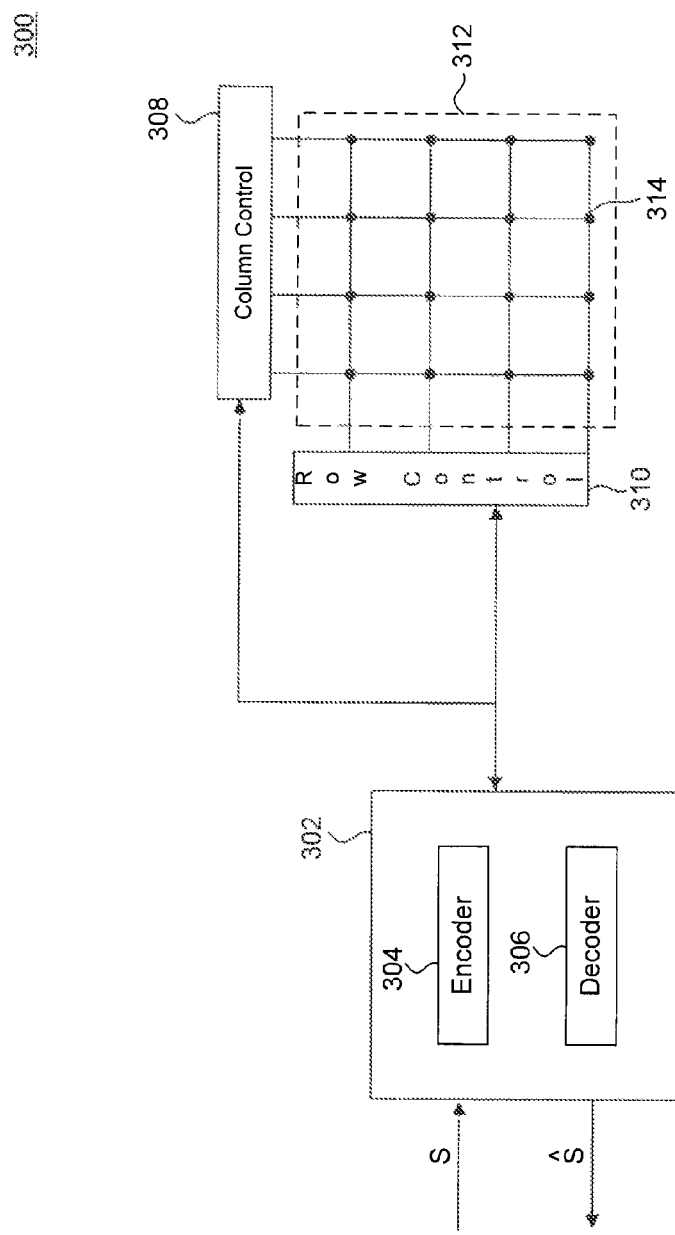
FIG. 3 shows a block diagram of a memory system, according to an embodiment.

FIG. 3 shows a block diagram of a memory system 300, according to an embodiment. Memory system 300 includes a coding module 302, a column control module 308, a row control module 310, and a matrix of memory elements 312. Coding module 302 includes an encoder 304 and a decoder 306. As described in greater detail below with respect to FIG. 4, column control module 308 can includes a column decoder, a column voltage distributor subcircuit, and a column voltage selector subcircuit. Row control module 310 can include a row decoder, a row voltage distributor subcircuit, and a row voltage selector subcircuit.

Matrix of memory elements 312 includes memory elements 314. In the embodiment shown in FIG. 3, matrix of memory elements 312 is shown to be a 4×4 matrix. As will be understood by those skilled in the relevant arts, however, arrays of different sizes can also be used. In an embodiment, memory elements 314 are memristors, each having a respective memductance that can be set and measured by column control module 308 and row control module 310.

As shown in FIG. 3, coding module 302 receives an input in data S to be stored and outputs an estimate of that data A. In an embodiment, encoder 304 can be configured to implement the functionality of encoder 110 and decoder 306 can be configured to implement the functionality of decoder 130. For example, encoder 304 can determine values for two adjacent memory elements 314 in array 312 based on the received data S. Encoder 304 can then output a signal representative of these values to column control module 308 and row control module 310.

Column control module 308 and row control module 310 can execute a write operation such that the quantities of selected memory element(s) 314 are set to the values determined by encoder 304. For example, column control module 308 and row control module 310 can output voltages that result in the quantities of the selected memory elements 314 being flushed and set to the values determined by encoder 304. For example, in the embodiment in which memory elements 314 are memristors, the output voltages can result in the memductances of the selected pair of memristors being flushed and set to values determined by encoder 304.

When data stored using array 312 is to be accessed, column control module 308 and row control module 310 can execute a read operation in which the quantities of selected elements are measured and output to coding module 302. For example, in the embodiment in which memory elements 314 are memristors, column control module 308 and row control module 310 can measure the memductances of a selected pair of memory elements 314 and output signals representative of these values to coding module 302. Decoder 306 can receive the signals and determine estimate S from these signals.

Figure 4:
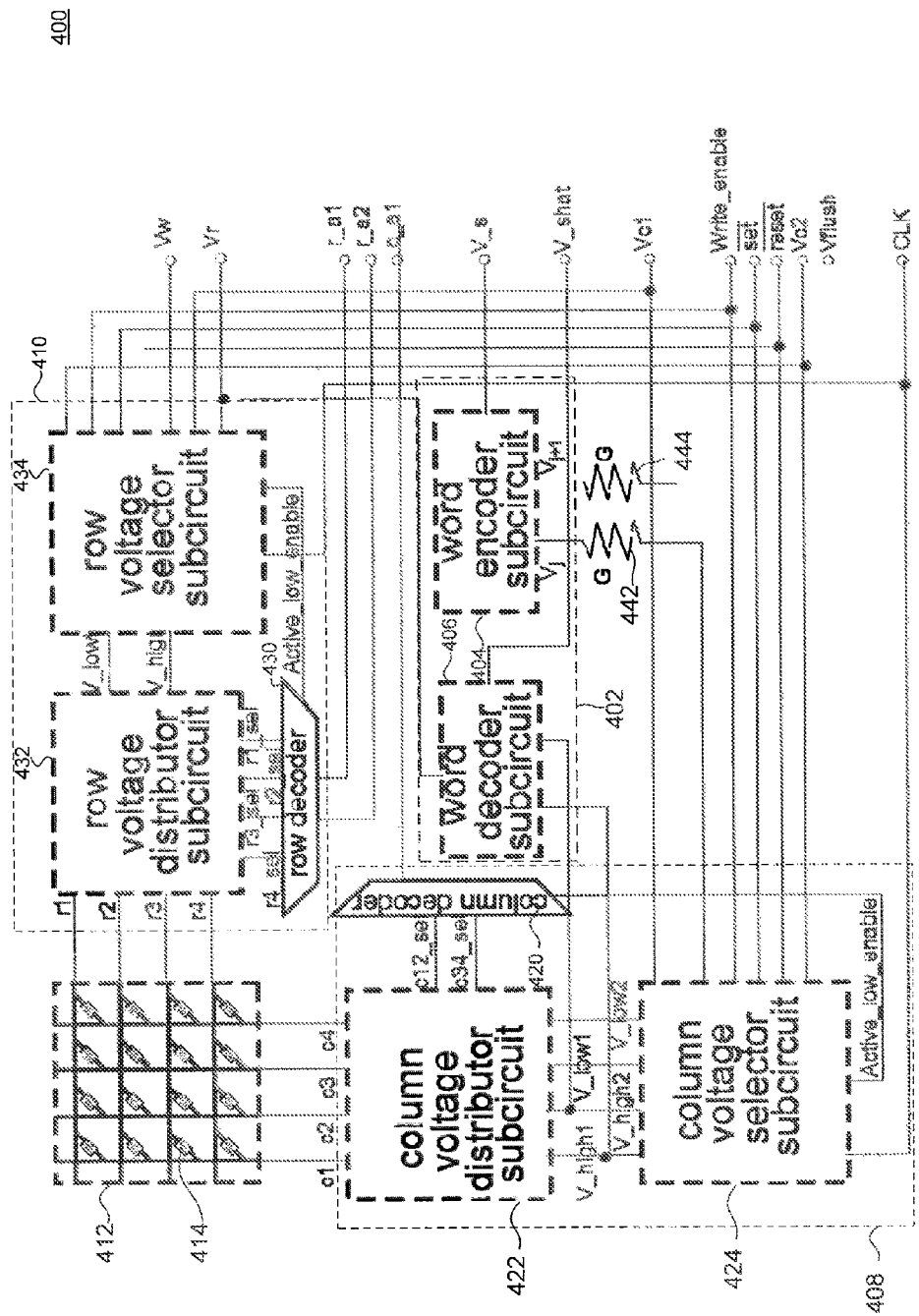
FIG. 4 shows a block diagram of a memory system, according to an embodiment.

FIG. 4 shows a block diagram of a memory system 400, according to an embodiment. Memory system 400 includes a coding module 402, a column control module 408, a row control module 410, and a matrix of memory elements 412. Coding module 402 includes an encoder 404 and a decoder 406. Column control module 408 includes a column decoder 420, a column voltage distributor subcircuit 422, and a column voltage selector subcircuit 424. Row control module 410 includes a row decoder 430, a row voltage distributor subcircuit 432, and a row voltage selector subcircuit 434. Matrix of memory elements 412 includes memristors 414. As will be described in greater detail below, data S can be stored using memory system 400 by setting the memductance values of one or more memristors 414.

As shown in FIG. 4, encoder 404 is coupled to resistors 442 and 444, each have a memductances value of G. Encoder 404 receives a voltage V_s that is representative of data S to be stored in array of memory elements 412. For example, data S can be stored across two memory elements 414 of array of memory elements 412. In a further embodiment, these two memory elements 414 can be adjacent to each other in matrix of memory elements 412. As shown in FIG. 4, encoder 404 outputs two voltages, $V_j$ and $V_{j+1}$. Voltages $V_j$ and $V_{j+1}$ modify the memductances of a pair of memory elements 414 which will be used to store the data S. Exemplary operation of encoder 404 will be described in greater detail with respect to FIGS. 5-8.

Decoder 406 receives two voltages, V_high1 and V_high2, which are representative of the memductances of the memristors on which data is stored, and outputs a voltage $V\_\hat{s}$ which corresponds to data, Ŝ. Exemplary operation of decoder 406 will be described in greater detail below with respect to FIGS. 9-11.

Column decoder 420 receives a column control signal c_a1. As described above, data S can be stored across two selected memristors 414. In a further embodiment, the two selected memory elements 414 can be horizontally adjacent. For example, in FIG. 4, data can be stored either across the first and second columns or across the third and fourth columns. Column control signals c_a1 determines whether the memristors across which data is stored are in the first and second columns or the third and fourth (as described below, row decoder 430 determines which row the memristors are located in). For example, if column control signal c_a1 is at a logical low, the first and second columns can be selected, and if column control signal c_a1 is at a logical high, the third and fourth columns can be selected. As shown in FIG. 4, column decoder 420 outputs two signals: c12_sel and c34_sel. In an embodiment, column decoder 420 outputs signal c12_sel at a logical high if column control signal c_a1 selects the first and second columns and outputs signal c34_sel at a logical high if control signal c_a1 selects the third and fourth columns. In an embodiment, column decoder 402 can be implemented as a conventional 1-of-2 decoder.

Column voltage distributor subcircuit 422 receives the select signals c12_sel and c34_sel output by column decoder 420 and also receives voltages V_high1, V_high2, V_low1, and V_low2 from column voltage selector subcircuit 424. The operation of column voltage distributer subcircuit 422 can depend on the specific operation memory system 400 is conducting. During a writing operation, column voltage distributor subcircuit 422 controls the voltages of lines c1-c4 based on the inputs to column voltage distributor subcircuit. For example, column voltage distributor subcircuit 422 can use select signals c12_sel and c34_sel to determine which lines will receive which of voltages V_high1, V_high2, V_low1 and V—_low2. During a reading operation, column voltage distributor subcircuit outputs V_high1 and V_high2 to decoder 406 which represent the memductances of a selected pair of memristors. Exemplary operation of column voltage distributor subcircuit 422 will be described in greater detail with reference to FIG. 12.

Column voltage selector subcircuit 424 receives a clock signal, and a write_enable signal, set and reset signals, first and second control voltages Vc1 and Vc2, and a flush voltage Vflush. In an embodiment, column voltage selector subcircuit 424 determines which of the received voltages to output as V_high1, V_high2, V_low1 and V_low2 based on the operation that memory system 400 is executing, e.g., writing or reading. Exemplary operation of columns voltage selector subcircuit 424 will be described in greater detail below with respect to FIG. 15.

Row decoder 430 receives two row control signals r_a1 and r_a2. In an embodiment, row controls signals r_a1 and r_a2 can together select one of the rows of array of memory elements 412. Row decoder 430 can output a logical high to a select signal of select signals r1_sel, r2_sel, r3_sel, and r4_sel for each row that is selected. In addition, as shown in FIG. 4, row decoder 430 also receives an active_low_enable signal from row voltage selector subcircuit 434. In an embodiment, when signal active_low_enable signal is high, the operation of row decoder 430 is reversed. For example, if active_low_enable is high, the selected row signal is output by row decoder 430 at a logical low and the remaining row select signals are output at a logical high. Row decoder 430 is implemented as a conventional 2-to-4 decoder.

Row voltage distributor subcircuit 432 receives the select signals r1_sel, r2_sel, r3_sel, and r4_sel from a row decoder 430, and voltages V_high and V_low from row voltage selector subcircuit 434, and outputs voltages on lines r1-r4 of array 412. In an embodiment, row voltage distributor subcircuit 432 determines which of lines r1-r4 receives voltages V_low or V_high based on the select signals received from row decoder 430. For example, row voltage distributor subcircuit 432 can be configured such that for every select signal that is high, the corresponding line is output a voltage V_high and for every select signal that is low, the corresponding line is output a voltage V_low. Exemplary operation of row voltage distributor subcircuit 432 is described below with reference to FIG. 14.

Row voltage selector subcircuit 434 receives voltages write voltage Vw, read voltage Vr, control voltages Vc1 and Vc2, the write_enable signal, set and reset voltages, a flushing voltage Vflush, and a clocking signal clock. In an embodiment, row voltage selector subcircuit 434 selects from write voltage Vw, read voltage Vr, column control voltages Vc1 and Vc2, and flushing voltage Vflush to be output as V_low and V_high based on the operation that memory system 400 is being used for, e.g., read or write operation. The operation of row controller 410 will be described in greater detail below with respect to FIG. 13.

Figure 5:
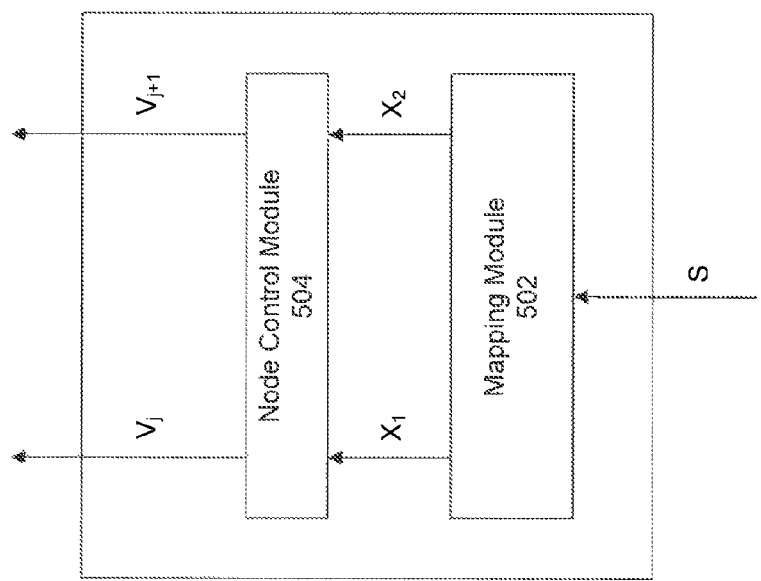
FIG. 5 shows a block diagram of an encoder, according to an embodiment.

III. Exemplary Analog Encoders and Decoders
A. Exemplary Encoding Modules FIG. 5 shows a block diagram of an encoder 500, according to an embodiment. Encoder 404 can be implemented as encoder 500 shown in FIG. 5. Encoder 500 includes a mapping module 502 and a node control module 504.

Mapping module 502 maps the data to values for quantities of memory elements in a matrix of memory elements. For example, as shown in FIG. 5, mapping module 502 maps the input data as to two memductance values $x_1$ and $x_2$. As described above with reference to FIG. 1, mapping input data as to a pair of values can be done in two steps. First, a stretching function can be used to map the data S to a length along a curve. As will be appreciated by those skilled in the relevant art, a stretching function can be any bijective function that maps a data sample. Mapping module 502 can then apply a pair of trigonometric functions to the result to generate values $x_1$ and $x_2$. For example, mapping module 502 can apply a sine function to generate value $x_1$ and a cosine function to generate value $x_2$.

Node control module 504 receives the mapped values $x_1$ and $x_2$. Node control module 504 uses these values to generate node voltages Vo1 and Vo2. The node voltages can also be referred to as $V_i$ or $V_{ij}$. In this notation, i refers to the row of the array and j refers of the array. Thus, a particular memory element can be identified using values i and j.

Node voltages $V_j$ and $V_{j+1}$ can be used to control selected memory elements such at their quantity is set to the values determined by mapping module 502. For example, voltages $V_j$ and $V_{j+1}$ can be used to set the memductances of a pair of adjacent memristors to values $x_1$ and $x_2$. Node control module 504 can calculate the node voltages $V_j$ and $V_{j+1}$ based on the determined values $x_1$ and $x_2$, respectively, as well as parameters associated with the memory elements. The parameters can include threshold voltages of the memristors and the writing voltage Vw that will be used to control the quantities of the memory elements as well as process-dependent variables associated with the memristors. In an embodiment, voltages $V_j$ and $V_{j+1}$ are linear functions of the determined values $x_1$ and $x_2$.

Figure 6:
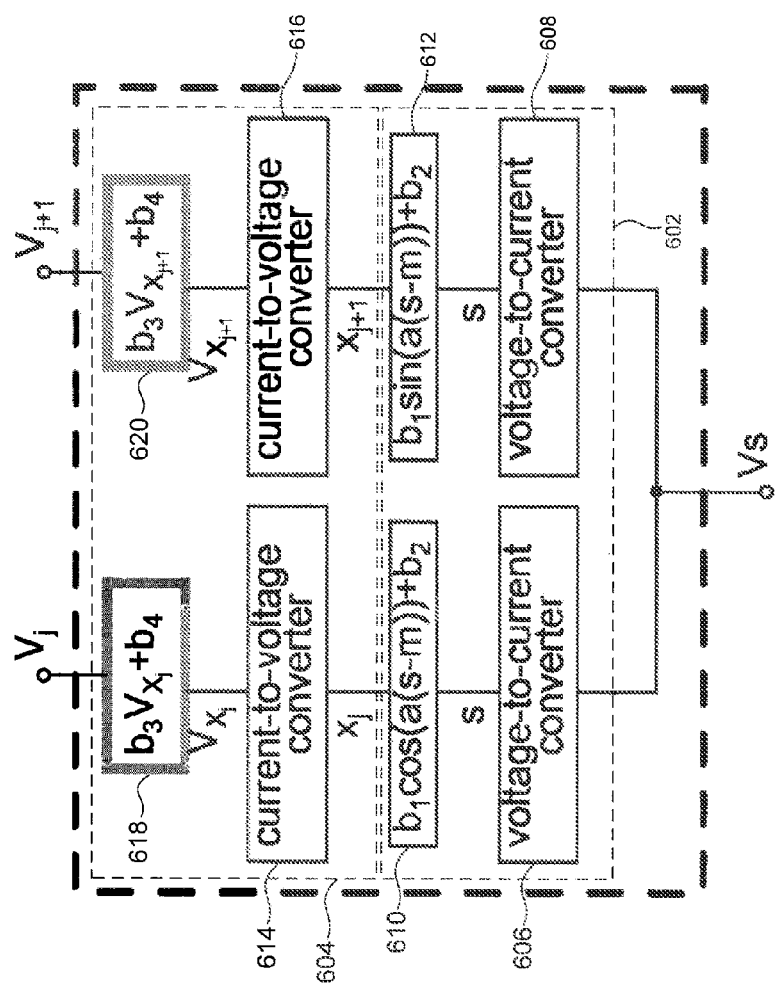
FIG. 6 shows a block diagram of an encoder, according to an embodiment.

FIG. 6 shows a block diagram of an encoder 600, according to an embodiment. Encoder 500 can be implemented as encoder 600 shown in FIG. 6. Encoder 600 includes a mapping module 602 and a node control module 604. Mapping module 602 includes voltage-to-current converters 606 and 608, and trigonometric computation modules 610 and 612. Node voltage control module 604 includes current-to-voltage converters 614 and 616 and computation blocks 618 and 620. In an embodiment, encoder 600 can be used to output node voltages for a first memristor located in column j and a second memristor located in column j+1.

Voltage-to-current converters 606 and 608 receive a voltage Vs indicative of data S. Voltage-to-current converters 606 and 608 output a current I_S indicative of the voltage Vs. Trigonometric computation blocks 610 and 612 receive the currents output by voltage-to-current converters 606 and 608, respectively. Trigonometric computation modules 610 and 612 compute memductance value $x_j$ and $x_{j+1}$ based on the received signals. For example, as shown in FIG. 6, trigonometric computation module 610 computes the following function:

$b_1 \cos(\propto(S-m))+b_2$, where:

$\alpha(\ )$, is the stretching function, and
$b_1$ and $b_2$ are scaling factors based on the particular type of memristor used.

Trigonometric computation module 612 computes the following function:

$b_1 \sin(\propto(S-m))+b_2$.

Trigonometric computation modules 610 and 612 output current signals indicative of values $x_j$ and $x_{j+1}$.

Current-to-voltage converters 614 and 616 of node control module 604 receive the current signals from trigonometric computation modules 610 and 612 and output respective voltage values $Vx_j$ and $Vx_{j+1}$. Scaling modules 618 and 620 receives the voltages $Vx_j$ and $Vx_{j+1}$ and output voltages $V_j$ and $V_{j+1}$, respectively which are sufficient to set the values of respective memristors to the determined values $x_j$ and $x_{j+1}$. In an embodiment, the particular computation applied by computation modules 618 and 620 can be derived based on a solution of the following ordinary differential equation (ODE):

$$\frac{dx_{ij}}{dt} = \beta x_{ij}^2 [V_w - V_{o,i,j} - V_T],$$

where:
$\beta$ is the slope parameter of the memristors,
$V_w$ is the writing voltage applied by encoder 600,
$V_{o,i,j}$ is the node voltage for a memristor located at row i and column j, and
$V_T$ is the threshold voltage of the memristors.

In an embodiment, for $TiO_2$ memristors, the solution to the above ODE is a linear equation as shown in FIG. 6. For example, computation modules 618 and 620 can compute the following linear functions: $b_3 V_{xj}+b_4$, and $b_3 V_{xj+1}+b_4$, respectively. Values $b_3$ and $b_4$ can be process dependent variables that can be determined through calibration of the particular type of memristor. In alternate embodiments, e.g., arrays with different types of memristors, other equations can be used as the solution to the above ODE, e.g., e.g., polynomials and/or trigonometric functions.

The embodiment of FIG. 6 shows computations being completed in current mode. In alternate embodiments, however, computations can be done in voltage mode. In such an embodiment, voltage-to-current converters 606, 608, 614, and 616 may not be required. The use of current mode, however, may result in a smaller size for the decoder and decreased power usage.

Figure 7:
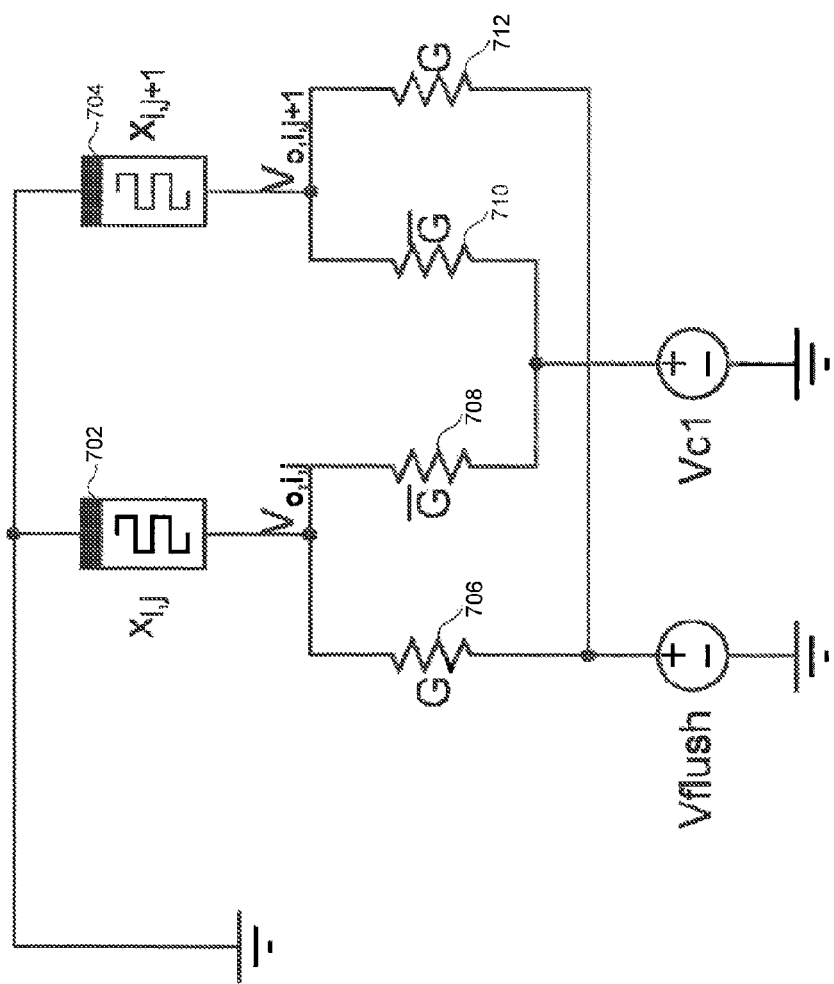
FIG. 7 shows an equivalent circuit during a first stage of a writing operation, according to an embodiment.

FIG. 7 shows an equivalent circuit during a first stage of writing, i.e., flushing, according to an embodiment. As shown in FIG. 7, the memductances of memristors 702 and 704 is sought to be flushed. In flushing the values of memristors 702 and 704, however, the voltages must be maintained such that the memductances of the remaining elements in the array are not altered. To ensure that the memductances of memristors 702 and 704 is flushed, the voltage Vflush must be larger than the threshold voltages of memristors 702 and 704, VT. To ensure that the remaining memristors are not flushed, the control voltage Vc1 must remain less than the threshold voltages for the memristors, and the differences between the output voltages of memristors 702 and 704 and the control voltage Vc1 must be less than the threshold voltage for the memristors so that the memristors are not flushed. Using these voltage relationships, a voltage Vflush can be derived that allows for flushing of memristors 702 and 704 without affecting the remaining elements in the array.

Figure 8:
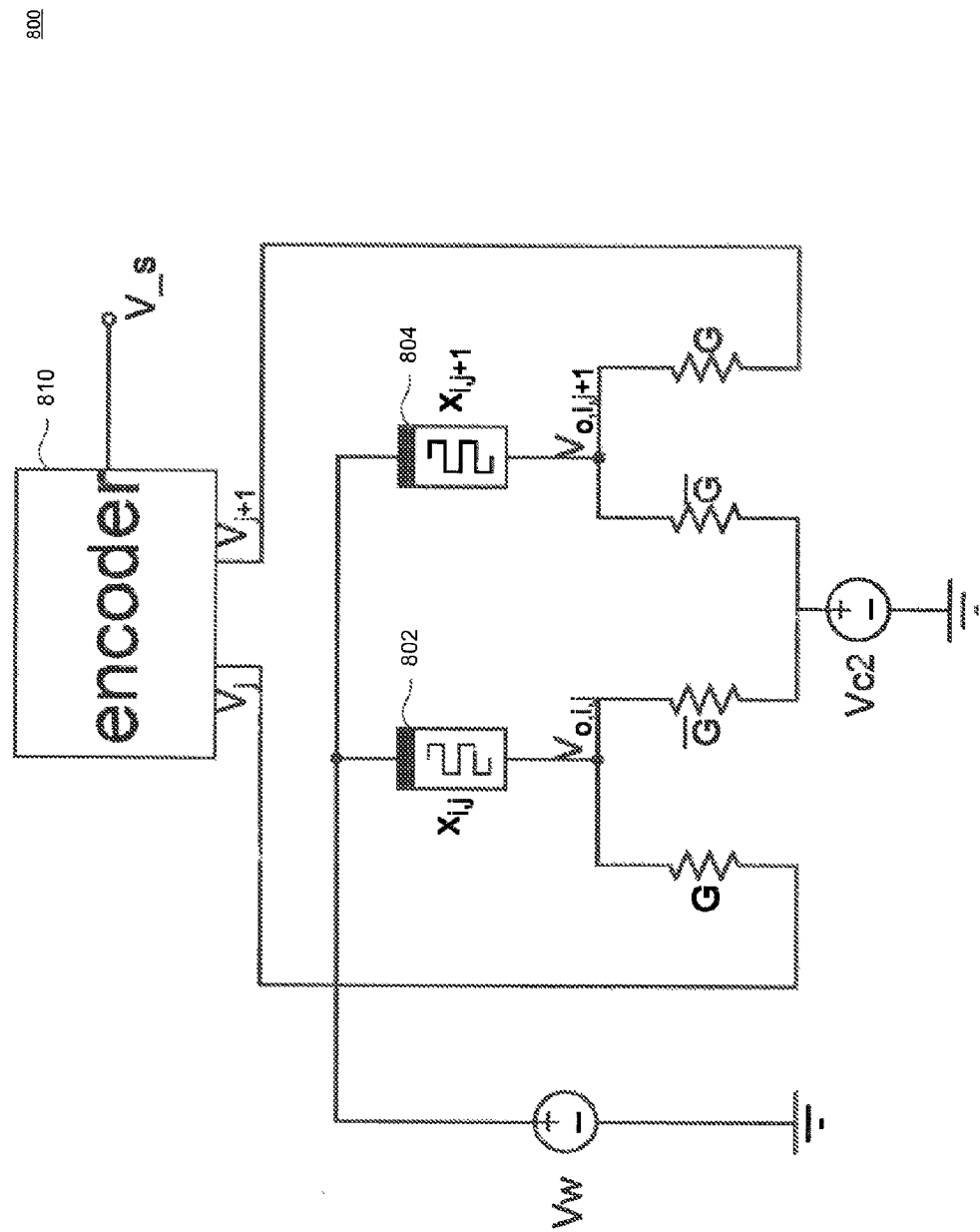
FIG. 8 shows an equivalent circuit for a second stage of a writing operation, according to an embodiment.

FIG. 8 shows an equivalent circuit 800 for a writing stage, according to an embodiment. As shown in FIG. 8, encoder 810 outputs voltages $V_j$ and $V_{j+1}$ to write values to memristors 802 and 804, respectively. In the writing stage, the voltages applied to the memory array must be such that values are only written to the selected memristors while the memductances values of the remaining memristors stays the same. To ensure this occurs, the absolute value of the difference between the writing voltage Vw and the second control voltage Vc2 must be less than the threshold voltages of memristors 802 and 804, $V_T$ and the difference between voltages $V_{i,j}$ and $V_{ij+1}$ and Vc2 must be less than the threshold voltage. In addition, the output voltages of memristors 802 and 804, $V_{i,j}$ and $V_{i,j+1}$ minus the writing voltage Vw must be larger than the threshold voltage, VT, so that values can be written to memristors 802 and 804.

B. Exemplary Decoding Modules

Figure 9:
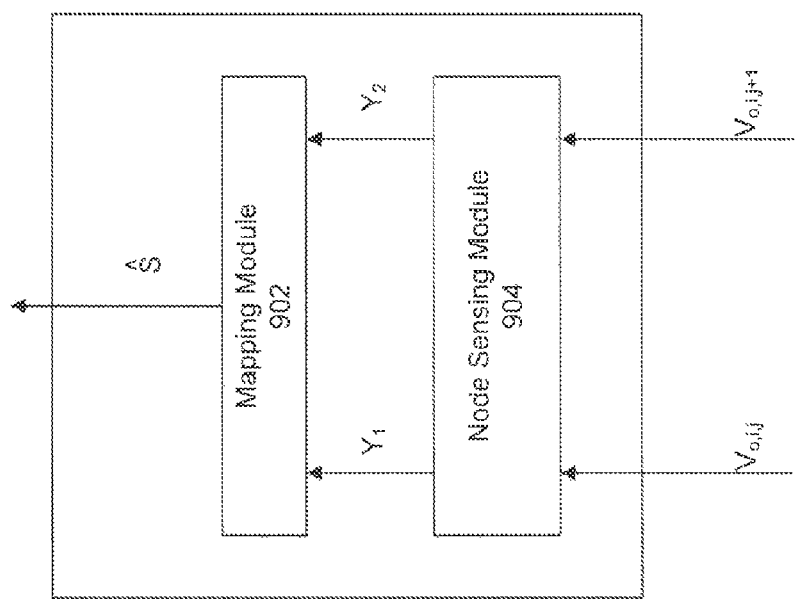
FIG. 9 shows a block diagram of a decoder, according to an embodiment.

FIG. 9 shows a block diagram of a decoder 900, according to an embodiment.

Decoder 406 shown in FIG. 4, can be implemented as decoder 900. Decoder 900 includes a mapping module 902 and a node sensing module 904.

Node sensing module 904 receives the output voltages of memristors located at row i, columns j and j+1. Node sensing module 904 performs computations on the received output voltages and outputs currents $Y_1$ and $Y_2$ corresponding to noisy measurements of memductances $x_j$ and $x_{j+1}$. Mapping module 902 receives the currents $Y_1$ and $Y_2$ and maps them to an estimate 9 of data S. In an embodiment, mapping module 902 performs a trigonometric function on the noisy measurement values of $x_j$ and $x_{j+1}$ to determine estimate Ŝ.

Figure 10:
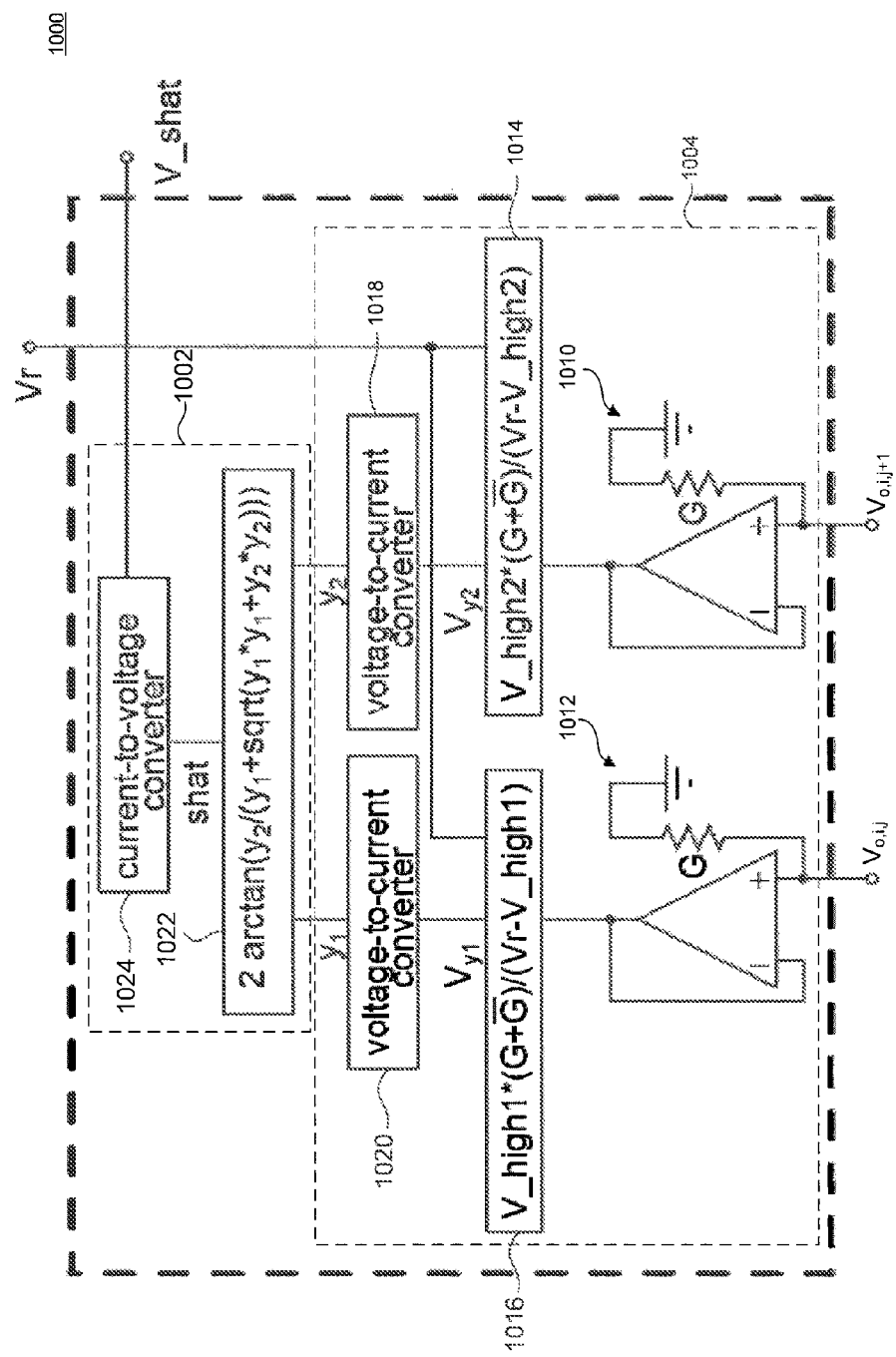
FIG. 10 shows a block diagram of a decoder, according to an embodiment.

FIG. 10 shows a schematic diagram of a decoder 1000, according to an embodiment. Decoder 900 can be implemented as decoder 1000. As shown in FIG. 10, decoder 1000 includes a node sensing module 1004 and a mapping module 1002. Mapping module 1002 includes a trigonometric computation module 1022 and a current-to-voltage converter 1024. Node sensing module 1004 includes buffers 1010 and 1012, computation modules 1016 and 1014, and voltage-to-current converters 1018 and 1020.

Buffers 1010 and 1012 receive the output $V_{o,i,j}$ and $V_{o,i,j+1}$. Each of buffers 1010 and 1012 can be implemented as shown in FIG. 10 as unity gain amplifiers. In such an embodiment, buffers 1010 and 1012 can prevent operations conducted by decoder 1000 from affecting the remaining portions of the memory system. Buffers 1010 and 1012 output voltages $V_{o,i,j}$ and $V_{o,i,j+1}$ to computation modules 1014 and 1016, respectively.

Computation modules 1014 and 1016 are configured to convert the received voltages to voltages indicative of the selected memductances. For example, in an embodiment, computation modules 1014 and 1016 each compute respective values according to equation:

$$V\_highx \times (G+\overline{G})/(V_r - V\_highx), \text{ where}$$

V_highx is V_high1 for the memristor located at column j and V_high2 for the memristor located at column j+1;

$V_r$ is the reading voltage; and

G and $\overline{G}$ are the memductances for the remaining portion of the array.

As shown in FIG. 10, each of computation modules 1014 and 1016 output a respective voltage $V_{y2}$ and $V_{y1}$. Voltages $V_{y1}$ and $V_{y2}$ are received by voltage-to-current converters 1018 and 1020, respectively. Voltage-to-current converters 1018 and 1020 convert the received voltages to currents $I_{y1}$ and $I_{y2}$, respectively.

Mapping module 1002 includes trigonometric computation module 1022 and current-to-voltage converter 1024. As noted above with respect to FIG. 1, in the decoding process, the pair of values can be mapped to a single value that is indicative of an estimate of the stored data by calculating the distance along the curve corresponding to the two different values. In the embodiment of FIG. 10, trigonometric computation module 1022 uses an arctan function of the two received values to calculate this distance. For example, in the embodiment of FIG. 10, the trigonometric computation module 1022 calculates the estimate value Ŝ according to equation based on the received values $y_1$ and $y_2$:

$$2 \arctan(y2/(y1+\sqrt{y_1^2 y_2^2})).$$

The estimate value Ŝ is output to current-to-voltage converter 1024. Current-to-voltage converter 1024 output a respective voltage V_shat.

The embodiment of FIG. 10 shows computations being completed in current mode. In alternate embodiments, however, computations can be done in voltage mode. In such an embodiment, voltage-to-current converters 1018, 1020 and 1024 may not be required. The use of current mode, however, may result in a smaller size for the decoder and decreased power usage.

Figure 11:
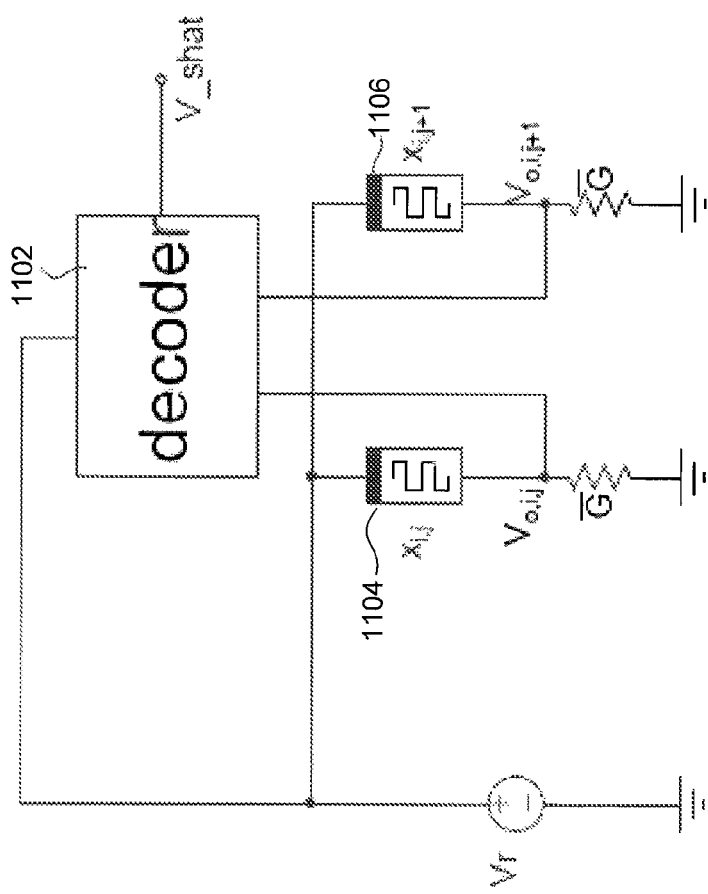
FIG. 11 shows an equivalent circuit during a reading operation, according to an embodiment.

FIG. 11 shows an equivalent circuit for a reading operation, according to an embodiment. As shown in FIG. 11, decoder 1102 senses the output values $V_{o,i,j}$ and $V_{o,i,j+1}$ corresponding to the output voltages provided by memristors 1104 and 1106. During the decoding or reading operation of the memory system, the read voltage Vr is applied to the memory array. To ensure that the memductances of all the memristors in the array of memristors does not change, the read voltage Vr must be less than the threshold voltage VT of the memristors. In FIG. 11, $\overline{G}$ represents the effective memductances of the sneak path during a reading operation. In an embodiment, G can be defined as follows:

$$\overline{G} = (M_r - 1)\overline{x}, \text{ where:}$$

$M_r$ is the number of rows in the matrix of memory elements; and $\overline{x}$ is the average and initial value of the memductances across the matrix of memory elements.

IV. Exemplary Memory Controller Modules

A. Exemplary Voltage selector Modules

In an embodiment, a write_enable signal can indicate the current operation of the memory system. For example, if the write_enable signal is at a logic high, the memory system can complete a writing operation, and if the write_enable signal is at a logic low, the memory system can complete a reading operation. To further differentiate between a flush stage and a write stage of a writing operation, a D flip flop coupled to a clock signal can be used. When the output of the D flip flop is at a logic low, the memory system is in a flush stage, and when the output of the D flip flop is at a logic high, the memory system is in the write stage.

Figure 12:
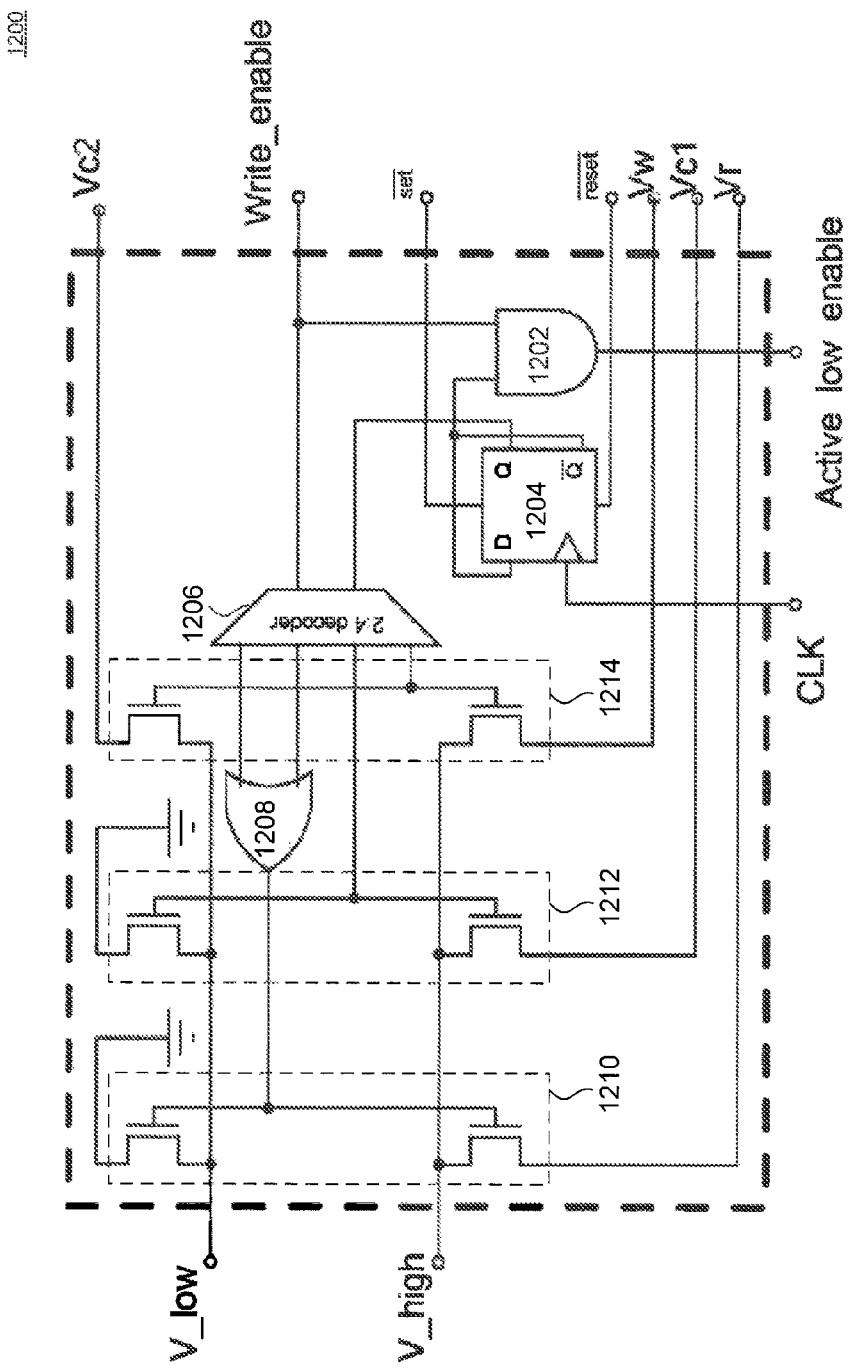
FIG. 12 shows a schematic diagram of a row voltage selector subcircuit, according to an embodiment.

FIG. 12 shows a schematic diagram of a row voltage selector subcircuit 1200, according to an embodiment. Row voltage selector subcircuit 434, shown in FIG. 4, can be implemented as row voltage selector subcircuit 1200. Row voltage selector subcircuit 1200 includes an AND gate 1202, a D flip flop 1204, a decoder 1206, an OR gate 1209, a write stage module 1208, a flush stage module 1210, and a read stage module 1212.

As shown in FIG. 12, row voltage selector subcircuit 1200 receives first and second control voltages Vc1 and Vc2, read and write voltages Vw and Vr, a write_enable signal, and a clock signal. Row voltage selector subcircuit 1200 outputs an active_low_enable, a low voltage V_low, and a high voltage V_high.

In an embodiment, row voltage selector subcircuit 1200 is configured to output voltages V_low and V_high based on the operation of the memory system. For example, and as summarized in Table 1 below, when the memory system is performing a read operation, row voltage selector subcircuit 1200 outputs ground as V_low and the read voltage Vr as V_high. When the memory system is in the flush stage, row voltage selector subcircuit 1200 outputs a ground as V_low and the first control voltage Vc1 as V_high. When the memory system is in the write stage, row voltage selector subcircuit 1200 outputs the second control signal Vc2 as V_low and the write voltage Vw as V_high.

TABLE 1

Exemplary Operation of Row Voltage Selector Subcircuit 1200

| Operation | Stage | Write_enable | V_low | V_high | Active_low_enable |
|---|---|---|---|---|---|
| Read | Read | Low | Ground | Vr | Low |
| Write | Flush | High | Ground | Vc1 | Low |
| Write | Write | High | Vc2 | Vw | High |

More specifically, during a read operation, the write_enable signal is at a logic low, which results in decoder 1206 activating read stage module 1210 through OR gate 1208. By activating the transistors within read stage module 1210, voltage V_high is set to Vr and voltage V_low is set to ground. During the flush stage, the write_enable is raised to a logic high and the output of the D flip flop 1204 is low (based on the value of the received clock signal). This results in decoder 1206 activating flush stage module 1212. As a result, the V_low output voltage is set to ground and the V_high output signal is set to the first control voltage Vc1. During the write stage, the write_enable is remains at a logic high and the output of the D flip flop 1204 is raised to a logic high. As a result, decoder 1206 controls write stage module 1208 to be active and the output voltages V_high and V_low are set to the writing voltage Vw and the second control voltage Vc2, respectively.

As shown in FIG. 12, the active_low_enable signal is produced by AND gate 1202, which receives as inputs the write_enable signal and the output of D flip flop 1204. Thus, the signal active_low_enable is high only in the write stage of the write operation when both the write_enable signal and the output of D flip flop 1204 are at a logical high. Otherwise, the active low enable is at a logical low.

Figure 13:
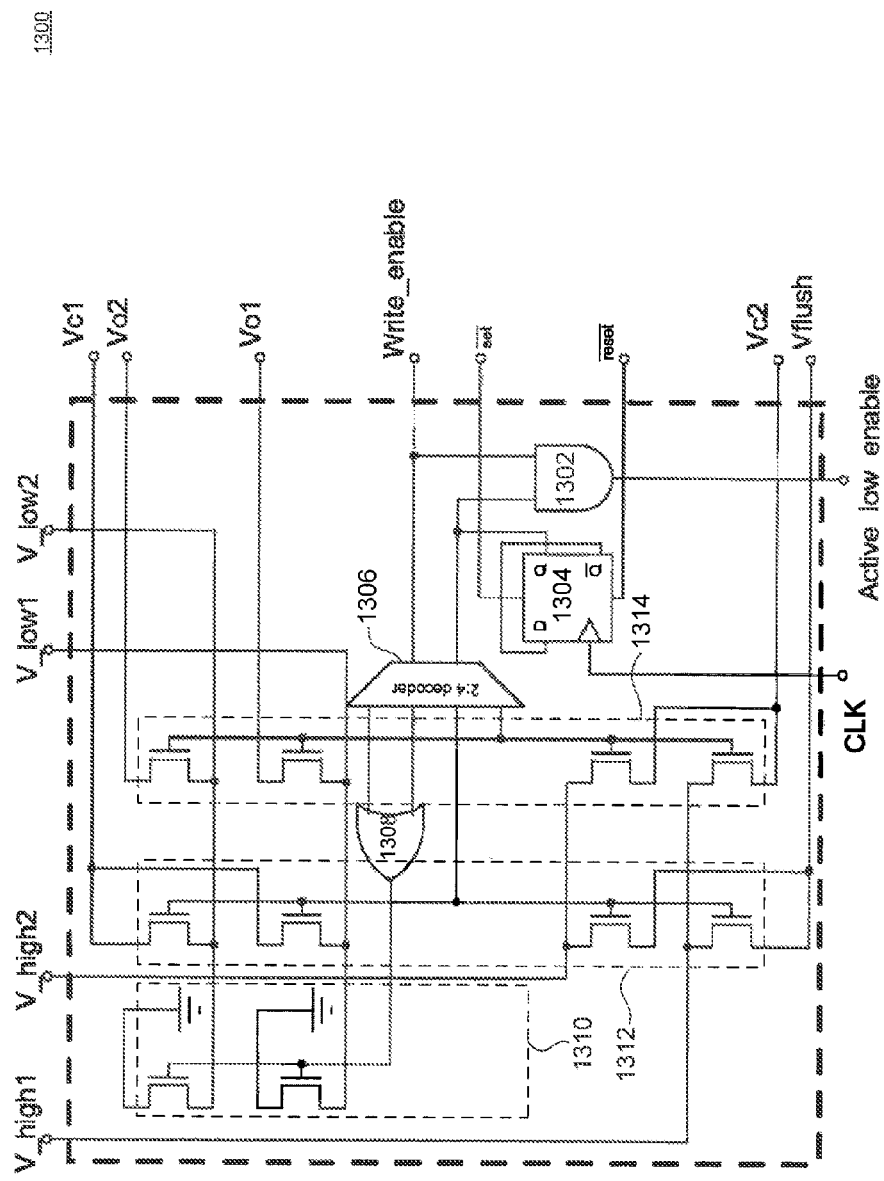
FIG. 13 shows a schematic diagram of a column voltage selector subcircuit, according to an embodiment.

FIG. 13 shows a schematic diagram of a column voltage selector subcircuit 1300, according to an embodiment. In an embodiment, column voltage selector subcircuit 424 can be implemented as column voltage selector subcircuit 1300. As shown in FIG. 13, column voltage selector subcircuit 1300 includes an AND gate 1302, a D flip flop 1304, a decoder 1306, an OR gate 1308, a read stage module 1310, a flush stage module 1312, and a write stage module 1314. Column voltage selector subcircuit 1300 receives memristor programming voltages Vo1 and Vo2, first and second control voltages Vc1 and Vc2, the write_enable signal, the flush voltage Vflush, and a clock signal. Column voltage selector subcircuit 1300 outputs and an active_low_enable signal, high voltages V_high1 and V_high2, and low voltages V_low1 and V_low2.

In an embodiment, column voltage selector subcircuit 1300 is configured to output voltages V_high1, and V_high2, voltages V_low1, and V_low2 based on the operation of the memory system. For example, and as summarized in Table 2 below, when the memory system is performing a read operation, column voltage selector subcircuit 1200 outputs ground as V_low1 and V_low2, and V_high1 and V_high2 are left floating. When the memory system is in the flush stage, column voltage selector subcircuit 1300 outputs first control voltage Vc1 as V_low1 and V_low2, and the flush voltage Vflush as V_high1 and V_high2. When the memory system is in the write stage, column voltage selector subcircuit 1300 outputs memristor programming voltages Vo,1 and Vo2 as V_high1 and V_high2, respectively and the second control signal Vc2 as voltages V_low1 and V_low2.

TABLE 2

Exemplary Operation of Column Voltage Selector Subcircuit 1300

| Operation | Stage | Write_enable | V_low1 | V_low2 | V_high1 | V_high2 | Active_low_enable |
|---|---|---|---|---|---|---|---|
| Read | Read | Low | Ground | Ground | Floating | Floating | Low |
| Write | Flush | High | Vc1 | Vc1 | Vflush | Vflush | Low |
| Write | Write | High | Vc2 | Vc2 | Vo, 1 | Vo, 2 | High |

More specifically, during a read stage, write_enable signal is set to logic low. When the output of D flip flop 1304 is at a logic low, the first output from decoder 1306 is at a logic high, and when the output of D flip flop 1304 is at a logic high, the second output from decoder 1306 is at a logic high. OR gate 1308 ensures that in both of these cases, the output to read stage 1310 is a logic high. Thus, during a read operation, V_low1 and V_low2 are set to ground, and V_high1 and V_high2 are floating.

During a flush stage of a write operation, the write_enable signal is transitioned to logic high, D flip flop 1304 first outputs a logic low, and thus the third output of decoder 1306 is a logic high. As result, flush stage module 1312 to be active. Consequently, V_high1 and V_high2 are set to Vflush and V_low1 and V_low2 are set to Vc1. During a write stage of the write operation, D flip flop 1304 outputs a logic high and write_enable remains at logic high. Thus, the fourth output of decoder 1306 is raised to a logic high, resulting in write stage module 1314 being activated. As a result, V_high1 and V_high2 are set to Vc2 and V_low1 and V_low2 are set to Vo1 and Vo2.

In addition, during the write stage, the output of D flip flop 1304 and the state of the write_enable signal are both a logic high, resulting in the output of AND gate 1302 being a logic high. Thus, in the write stage of the write operation, the active_low_enable signal is at a logic high (and at a logic low otherwise).

B. Exemplary Voltage Distribution Modules

Figure 14:
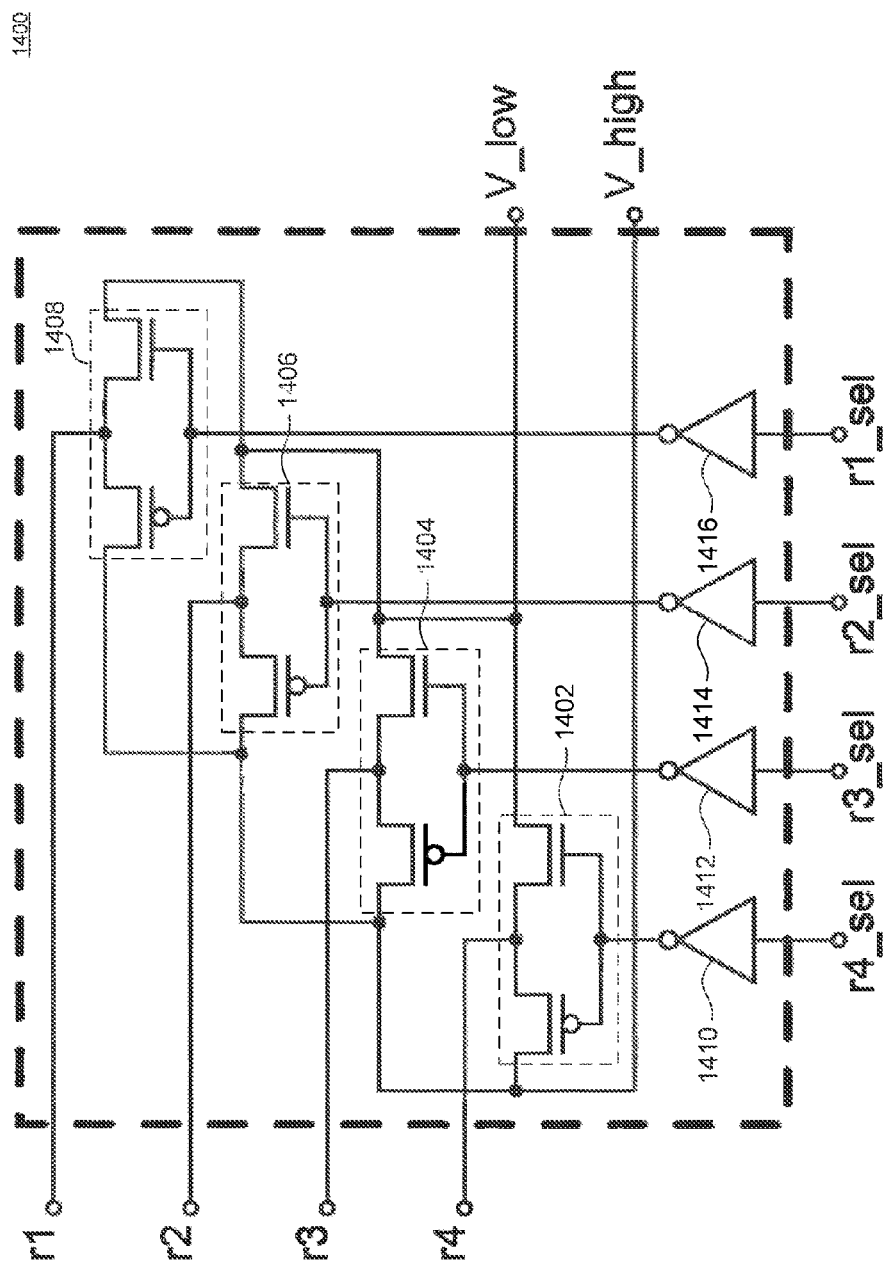
FIG. 14 shows a schematic diagram of a row voltage distributor subcircuit, according to an embodiment.

FIG. 14 shows a schematic diagram of a row voltage distributor subcircuit 1400, according to an embodiment. In an embodiment, row voltage distributor subcircuit 432 can be implemented as row voltage distributor subcircuit 1400. As shown in FIG. 14, row voltage distributor subcircuit 1400 includes distribution modules 1402, 1404, 1406 and 1408 and buffers 1410, 1412, 1414, and 1416. Buffers 1410, 1412, 1414, and 1416 can be used to isolate column voltage distribution circuit 1400 from the remaining portions of the circuit.

As shown in FIG. 14, each of distribution modules 1402-1408 is implemented with PMOS and NMOS transistors, which each have their gates coupled to a respective one of row selection signals r1_sel, r2_sel, r3_sel, and r4_sel. Thus, when the respective row selection signal is a logic high, the NMOS transistor of the distribution module is activated and the PMOS transistor of the distribution module is deactivated, resulting in voltage V_low being output to the respective output of outputs r1-r4. Conversely, when the respective row selection signal is a logic low, the PMOS transistor of the distribution module is activated and the NMOS transistor of the distribution module is deactivated, resulting in voltage V_high being output to the respective output of outputs r1-r4. For example, if row selection signals r1_sel, r2_sel, r3_sel, and r4_sel have the following pattern: low, high, low, and low, respectively, the outputs output signals r1, r2, r3, and r4 are set to: V_high, V_low, V_high, and V_high, respectively.

Figure 15:
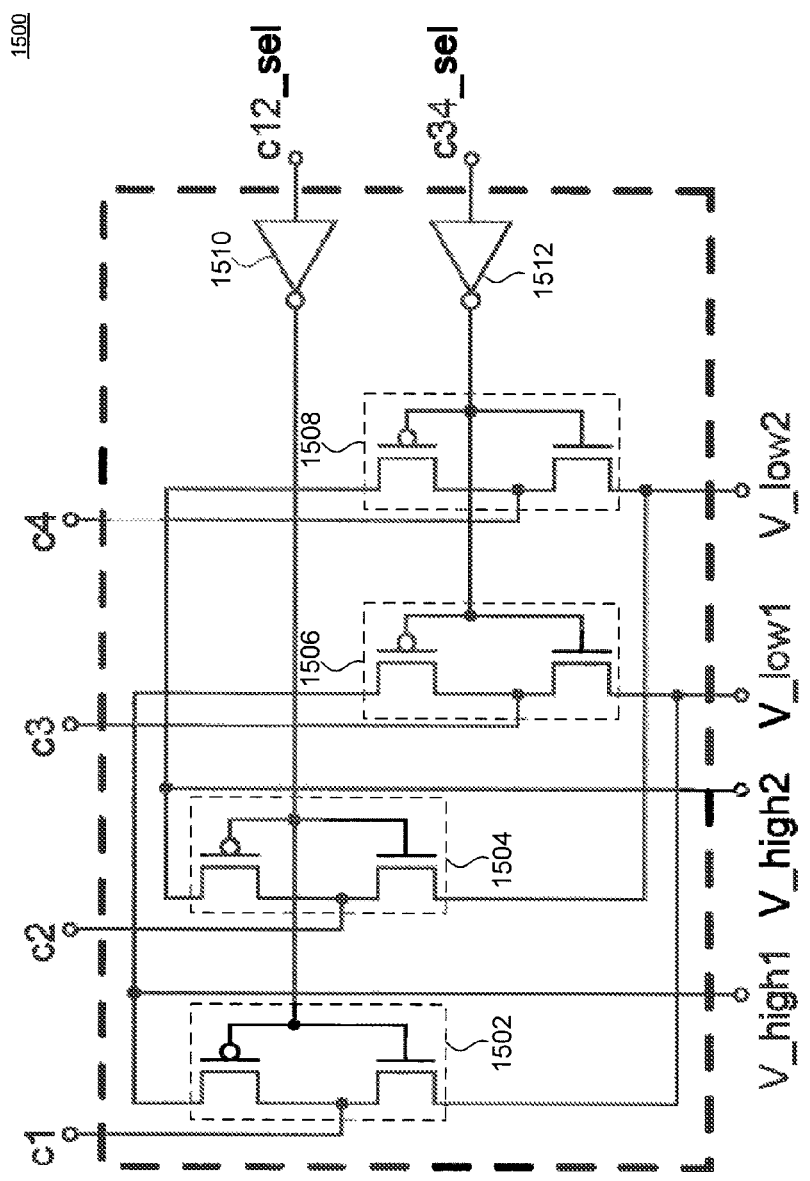
FIG. 15 shows a schematic diagram of a column voltage distributor circuit, according to an embodiment.

FIG. 15 shows a schematic diagram of a column voltage distributor circuit 1500, according to an embodiment. In an embodiment, column voltage distributor subcircuit 422, shown in FIG. 4, can be implemented as shown in FIG. 15. Column voltage distributor circuit 1500 includes distributor modules 1502-1508 and buffers 1510 and 1512. Distribution modules 1502-1508 are substantially similar to distribution modules 1402-1408, as shown in FIG. 14. Buffers 1510 and 1512 can be used to isolate column voltage distribution circuit 1500 from the remaining portions of the circuit.

Column voltage distribution circuit 1500 receives as inputs voltages V_high1, V_high2, V_low1, and V_low2, and column selection signals c12_sel and c34_sel. For example, column voltage distribution circuit 1500 can receive voltages V_high1, V_high2, V_low1, and V_low2 from a column voltage selector circuit (e.g., column voltage selector subcircuit 424, shown in FIG. 4) and selection signals c12_sel and c34_sel from a decoder (e.g., column decoder 420 shown in FIG. 4.)

In an embodiment, column voltage distribution circuit 1500 is configured to output either V_high1, V_high2, V_low1, or V_low2 to column voltage signals c1, c2, c3, or c4 based on selection signals c12_sel and c34_sel. For example, as summarized in Table 3 below, if selection signal c12_sel is at a logic high and selection signal c34_sel is at a logic low, and then modules 1502 and 1504 are activated and modules 1506 and 1508 are deactivated. As result, output signals c1 and c2 being set to V_low1 and V_low2, respectively, and output signals c3 and c4 are set to V_high1 and V_high2, respectively. Conversely, if column selection signal c34_sel is high and selections signal c12_sel is low, modules 1506 and 1508 are activated and modules 1502 and 1504 are deactivated. As a result, output signals c3 and c4 being set to V_low1 and V_low2 and signals c1 and c2 being set to V_high1 and V_high2, respectively.

TABLE 3

Operation of Column Voltage Distributor Subcircuit 1500

| c12_sel | c34_sel | c1 | c2 | c3 | c4 |
|---|---|---|---|---|---|
| High | Low | V_high1 | V_high2 | V_low1 | V_low2 |
| Low | High | V_low1 | V_low2 | V_high1 | V_high2 |

IV. Exemplary Methods

Figure 16:
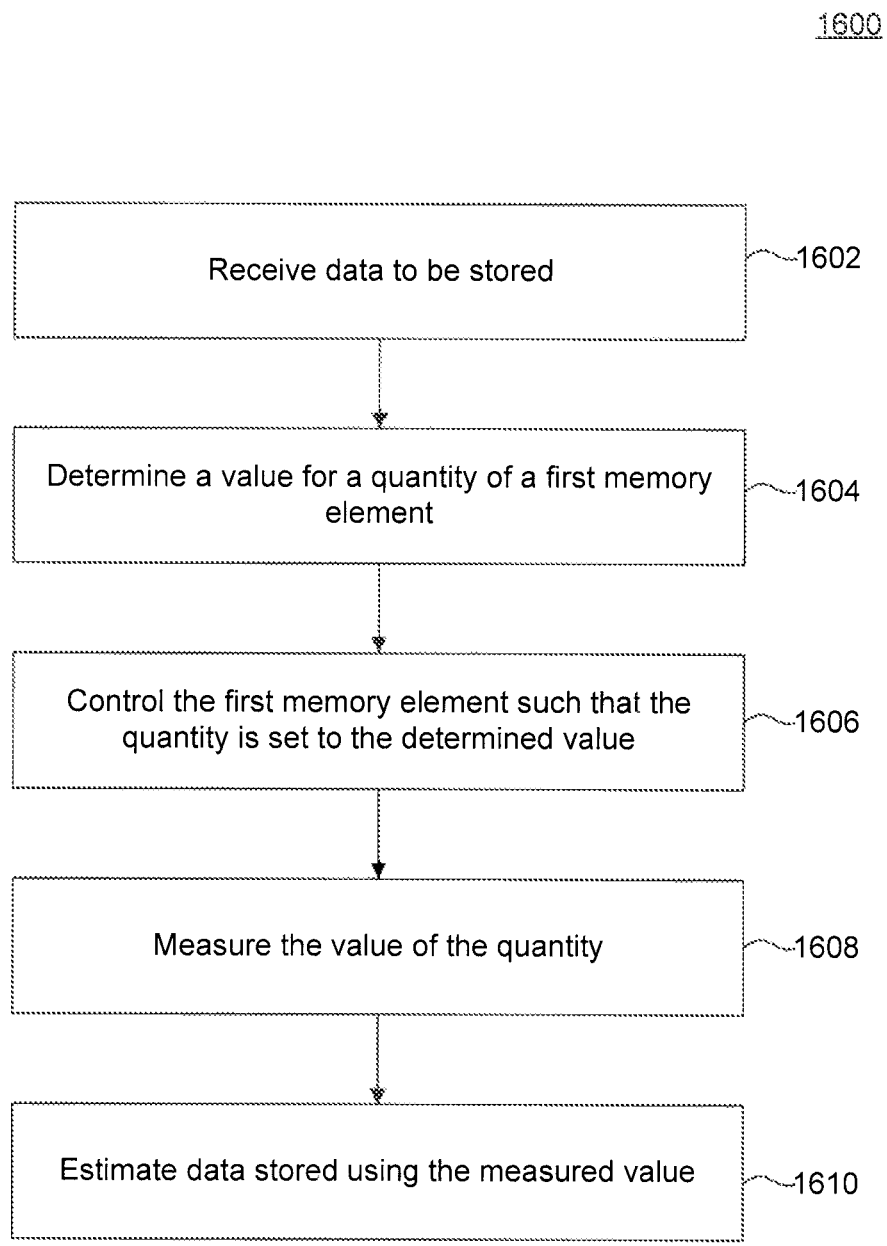
FIG. 16 shows a flowchart of an example method of storing and accessing data using a memory system, according to an embodiment.

FIG. 16 shows a flowchart of an example method 1600 of storing and accessing data using a memory system, according to an embodiment. These steps shown in FIG. 16 do not have to occur in the order shown. Nor does method 1600 require all the steps shown in FIG. 16 to be performed. The steps of FIG. 16 are described though.

In step 1602, data to be stored is received. For example, in FIG. 3, data S to be stored can be received at coding module 302.

In step 1604, a value for a quantity is determined for a first memory element. For example, in FIG. 3, encoder 304 can determine a value for a quantity of one or more memory elements 314 of array 312. For example, encoder 304 can determine a value of a memductance of one or more memristors 314 of array 312. As described above, encoder 304 can determine the values that will be assigned to two or more memory elements (e.g., two adjacent memristors 314).

In step 1606, the first memory element is controlled such that the quantity is set to the determined value. For example, in FIG. 3, column control module 308 and row control module 310 can control the respective memory elements to store a two-element codeword. As described above, column control module 308 and row control module 310 can output voltages such that one or more memory elements 314 of array 312 are set to the determined values.

In step 1608, the value of the quantity for one or more memory elements is measured. For example, in FIG. 3, column control module 308 and row control module 310 can measure the values of the stored codeword by measuring the memductance of one or more memory elements 314 of array 312.

In step 1610, data stored in the memory array can be estimated using the sensed value. For example, in FIG. 3, column control module 308 and row control module 310 can output the measured value to coding module 306. Decoder 306 can use the sensed value to determine an estimate Ŝ of the originally stored data S.

It is to be appreciated that the Detailed Description section, and not the Summary and Abstract sections, is intended to be used to interpret the claims. The Summary and Abstract sections may set forth one or more but not all exemplary embodiments of the present disclosure as contemplated by the inventor(s), and thus, are not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present disclosure should not be limited by any of the above-described exemplary embodiments, but should be defined only in accordance with the following claims and their equivalents.

What is claimed is:

1. A memory system, comprising:
   one or more memory elements, wherein a quantity associated with each of the one or more memory elements can take a value in a continuous range of values; and
   an encoder configured to determine a value for a quantity of a first memory element of the one or more memory elements based on data to be stored; and
   a memory controller comprising a row controller and a column controller, wherein the memory controller is configured to control the first memory element such that the quantity of the first memory element is set to the determined value, and wherein the row controller comprises a row voltage selector circuit configured to output a plurality of first voltages based on an output received from the encoder.

2. The memory system of claim 1, further comprising:
   a decoder configured to determine an estimate for the data based at least a measurement of the quantity of the first memory element.

3. The memory system of claim 2, wherein the one or more memory elements includes a matrix of memory elements.

4. The memory system of claim 3, wherein the encoder is configured to determine a value for a quantity of a second memory element of the one or more memory elements based on the data and wherein the decoder is configured to determine the estimate based on the measurement of the quantity of the first memory element and a measurement of the quantity of the second memory element.

5. The memory system of claim 1, wherein the row voltage selector circuit is configured to output a second voltage based on a voltage associated with the first memory element and wherein the decoder is configured to receive the second voltage.

6. The memory system of claim 1, wherein the row controller further comprises a row voltage distributor circuit configured to selectively apply the plurality of first voltages to rows of the matrix of memory elements based on an input received from the encoder.

7. The memory system of claim 3, wherein the column controller comprises a column voltage selector circuit configured to output a second plurality of second voltages based on the output received from the encoder.

8. The memory system of claim 7, wherein the column voltage selector circuit is configured to output a third voltage based on voltage associated with the first memory element and wherein the decoder is configured to receive the third voltage.

9. The memory system of claim 7, wherein the column controller further comprises a column voltage distributor circuit configured to selectively apply the second plurality of second voltages to columns of the matrix of memory elements based on an input received from the encoder.

10. The memory system of claim 1, wherein the encoder is configured to perform a trigonometric operation based on the data to determine the value for the first memory element.

11. The memory system of claim 1, wherein the one or more memory elements comprises a matrix of memristors.

12. The memory system of claim 11, wherein the quantity of the first memory element is a memductance.

13. A memory system, comprising:
    one or more memory elements, wherein a quantity associated with each of the one or more memory elements can take a value in a continuous range of values;
    a decoder configured to determine an estimate value for data based on a quantity of a first memory element of the one or more memory elements; and
    a memory controller comprising a row controller and a column controller, wherein the memory controller is configured to control the first memory element, wherein the row controller comprises a row voltage selector circuit configured to output a plurality of first voltages based on an output received from an encoder and to output a second voltage associated with the first memory element, and wherein the decoder is configured to receive the second voltage.

14. The memory system of claim 13, further comprising:
    a voltage distribution circuit configured to output one or more voltages indicative of the quantity, wherein the decoder is configured to determine the quantity from the one or more voltages.

15. The memory system of claim 13, wherein the one or more memory elements comprises a matrix of memristors.

16. The memory system of claim 13, wherein the decoder is configured to determine the estimate of the data based on the quantity of the first memory element and a quantity of a second memory element of the one or more memory elements.

17. The memory system of claim 16, wherein the first and second memory elements are adjacent to each other in a matrix of memory elements.

18. The memory system of claim 13, wherein the decoder is configured to perform a trigonometric function on the quantity of the first memory element to determine the estimate for the data.

* * * * *

UNITED STATES PATENT AND TRADEMARK OFFICE
CERTIFICATE OF CORRECTION

| | |
|---|---|
| PATENT NO. | : 9,330,738 B2 |
| APPLICATION NO. | : 14/257492 |
| DATED | : May 3, 2016 |
| INVENTOR(S) | : Robert McCormick Taylor, Jr. |

It is certified that error appears in the above-identified patent and that said Letters Patent is hereby corrected as shown below:

In the claims

Column 15, line 19, please replace "based at least a measurement" with --based on at least a measurement--.

Signed and Sealed this
Ninth Day of August, 2016

Michelle K. Lee
*Director of the United States Patent and Trademark Office*